US011404378B2

(12) United States Patent
Qian et al.

(10) Patent No.: US 11,404,378 B2
(45) Date of Patent: Aug. 2, 2022

(54) SEMICONDUCTOR DEVICE WITH BURIED METAL PAD, AND METHODS FOR MANUFACTURE

(71) Applicant: OmniVision Technologies, Inc., Santa Clara, CA (US)

(72) Inventors: Yin Qian, Milpitas, CA (US); Ming Zhang, Fremont, CA (US); Dyson H. Tai, San Jose, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/103,633

(22) Filed: Nov. 24, 2020

(65) Prior Publication Data

US 2022/0165670 A1 May 26, 2022

(51) Int. Cl.
*H01L 23/532* (2006.01)
*H01L 23/00* (2006.01)
*H01L 21/768* (2006.01)
*H01L 25/065* (2006.01)
*H01L 23/522* (2006.01)

(52) U.S. Cl.
CPC .... *H01L 23/5329* (2013.01); *H01L 21/76831* (2013.01); *H01L 23/5226* (2013.01); *H01L 24/05* (2013.01); *H01L 25/0657* (2013.01)

(58) Field of Classification Search
CPC .............. H01L 23/481; H01L 23/5329; H01L 23/5226; H01L 25/0657; H01L 25/50; H01L 24/05
See application file for complete search history.

(56) References Cited

U.S. PATENT DOCUMENTS

| 9,214,411 | B2* | 12/2015 | Park | H01L 21/76898 |
| 9,576,881 | B2* | 2/2017 | Akou | H01L 23/481 |
| 2008/0284041 | A1* | 11/2008 | Jang | H01L 21/76898 257/774 |
| 2013/0264676 | A1* | 10/2013 | Yang | H01L 21/76898 257/774 |
| 2013/0270670 | A1* | 10/2013 | Yang | H01L 24/11 257/499 |
| 2014/0284690 | A1* | 9/2014 | Arai | H01L 29/792 257/324 |
| 2018/0068928 | A1* | 3/2018 | Akou | H01L 23/481 |

* cited by examiner

*Primary Examiner* — Jaehwan Oh
*Assistant Examiner* — John M Parker
(74) *Attorney, Agent, or Firm* — Lathrop GPM LLP

(57) ABSTRACT

A semiconductor device that includes a metal pad buried in the semiconductor substrate that is electrically connected to a metal interconnection structure and electrically isolated from the semiconductor substrate. The semiconductor substrate forms an opening that extends from a back surface to the metal pad. A method for manufacturing a semiconductor device with buried metal pad including depositing, in a recess of a semiconductor substrate, a metal pad, isolating the pad from the substrate, electrically connecting the metal pad to the frontside of the substrate and connecting the metal pad to the backside of the substrate with an opening. A method for stabilizing through-silicon via connections in semiconductor device including electrically coupling a metal interconnection structure to a metal pad submerged in a semiconductor substrate and forming a through-silicon via into the semiconductor substrate that contacts the metal pad.

20 Claims, 7 Drawing Sheets

800

810
ELECTRICALLY COUPLE A METAL INTERCONNECTION STRUCTURE TO A METAL PAD SUBMERGED IN A SEMICONDUCTOR SUBSTRATE, THE METAL PAD ELECTRICALLY ISOLATED FROM THE SEMICONDUCTOR SUBSTRATE, THE METAL INTERCONNECTION STRUCTURE DISPOSED ON A FIRST SUBSTRATE SURFACE OF THE SEMICONDUCTOR SUBSTRATE.

812
ELECTRICALLY COUPLING THE METAL INTERCONNECTION STRUCTURE TO THE METAL PAD THROUGH ONE OR MORE CONDUCTIVE CONTACTS.

820
FORM A THROUGH-SILICON VIA IN THE SEMICONDUCTOR SUBSTRATE THAT CONTACTS THE METAL PAD FROM A SECOND SUBSTRATE SURFACE OF THE SEMICONDUCTOR SUBSTRATE, THE SECOND SUBSTRATE SURFACE OPPOSITE THE FIRST SUBSTRATE SURFACE.

*FIG. 8*

SEMICONDUCTOR DEVICE WITH BURIED METAL PAD, AND METHODS FOR MANUFACTURE

BACKGROUND

Integrated circuits have enabled the miniaturization of electronic and computational processes in consumer electronics such as image sensors of cameras in mobile devices. Application-specific integrated circuits (ASICs) are integrated circuits that are designed for a specific use rather than a general use. Integrated circuits make use of building circuitry onto semiconductors substrates forming semiconductor devices. This design has allowed the length-scale of circuits to decrease dramatically. Multiple integrated circuits can be combined to form chip-scale packages, which afford an even greater densification of electronic hardware.

SUMMARY OF THE EMBODIMENTS

By stacking multiple integrated circuits on top of each other, more circuitry can fit into a small volume. 3D integrated circuits require new forms of connectivity to bridge between individual integrated circuits of the chip-scale package. Substrates of two integrated circuits may be bonded together through oxide bonding or hybrid bonding with the metal interconnection structures of the two can be connected through electrical contacts or metal bond pad. More complicated chip-scale packages require passing electrical connections through the semiconductor substrate. This may be accomplished using a through-silicon vias or through substrate vias (TSV), which are made forming an opening through the semiconductor substrate and coating the opening with conductive material. TSV can form an electrical connection from the "backside" of the substrate to the metal interconnection structure formed on the "frontside" of the substrate.

Conventional TSV structures are vulnerable to mechanical strain that may cause failure of the integrated circuit to which they are connected. One reason that TSV cause vulnerability to mechanical strain is that the opening formed into the semiconductor substrate contacts a metal interconnections structure that is embedded in a low-κ, inter-layer dielectric. The inter-layer dielectric is porous and has reduced mechanical stability. Additionally, to reduce the thickness of the overall device structure and to reduce fabrication time and cost of the metal interconnection structure, it is advantageous to reduce the thickness of the metal interconnection structure. As a result, strain introduced onto the metal interconnection structure by the formation of one or more TSVs may cause structural damage to the inter-layer dielectric or to the metal interconnection structure resulting in cracks and delamination, both of which may damage the performance of the semiconductor device for example causing electrical leakage. Due to both the structure of the low-κ, inter-layer dielectric and the reduced thickness of the metal interconnection structure, TSV lead to reduced mechanical stability and degrade device reliability.

One method of forming a TSV requires forming an opening in the semiconductor substrate, which is often done by etching material from the backside of the semiconductor substrate. The opening formed contacts the metal interconnection structure bound to the front face of semiconductor substrate. The depth tolerance of fabricating this opening is dictated by the thickness of the material to which the eventual TSV will contact. The metal layer of metal interconnection structures to which TSV contacts may be as thin as 800 angstroms, which leads to a relatively narrow depth tolerance for etching processes, which can lead to increased manufacturing costs and failure rates. Mechanical stability is especially important to industries that make use of semiconductor device packaging process with TSV for establishing electrical connections in mobile devices, automotive devices, and outdoor devices, where mechanical demands structures are greater.

Embodiments described herein ameliorate the above challenges by using a metal pad that is submerged in the frontside of the semiconductor substrate of a semiconductor device and which contacts the TSV. This metal pad is electrically isolated from the semiconductors substrate but is electrically connected to the metal interconnection structure formed on the semiconductor substrate, thereby forming an electrical channel from the backside of the semiconductor substrate to the frontside of the semiconductor substrate.

Use of a metal pad to contact the TSV makes the semiconductor device structure more resilient to mechanical strain. Making the metal pad is thicker than the metal interconnection structure allows for increased robustness and reduced likelihood of fracture or disconnections to its associated electrical connections. Additionally, since the metal pad is embedded in the semiconductor substrate rather than the porous inter-layer dielectric, it is more robust against forces that might otherwise cause damage to the electrical contact or its connected structures. Use of a metal pad to contact the TSV loosens the depth tolerance requirements of the etching process, which can reduce manufacturing costs and reduce the failure rate of the manufacturing process.

In an embodiment, a semiconductor device includes a semiconductor substrate, having a first substrate surface and a second substrate surface thereopposite; a first inter-layer dielectric layer disposed on the first substrate surface; a second inter-layer dielectric layer disposed on the inter-layer dielectric layer; a metal interconnection structure embedded within the second inter-layer dielectric layer; and a metal pad at least partly buried in the semiconductor substrate, electrically connected to the metal interconnection structure, and electrically isolated from the semiconductor substrate; wherein the semiconductor substrate forms an opening that extends from the second substrate surface to the metal pad.

In an embodiment, a method for manufacturing a semiconductor device includes etching a recess that extends into a first substrate surface of a semiconductor substrate, the semiconductor substrate having a second substrate surface opposite the first substrate surface; depositing a recess-insulating layer that coats a semiconductor substrate surface that forms the recess; depositing a metal layer in the recess, the recess-insulating layer electrically isolating the metal layer from the semiconductor substrate; etching the metal layer to form a metal pad; depositing an dielectric material to form an inter-layer dielectric layer covering the first substrate surface and the top surface of the metal pad; forming at least one conductive contact that extends through the inter-layer dielectric layer and contacts the metal pad; and forming, in the semiconductor substrate, an opening that extends from the second substrate surface to the metal pad.

In an embodiment, method for stabilizing through-silicon via connections in semiconductor device improving process reliability includes coupling electrically a metal interconnection structure to a metal pad that is submerged in a semiconductor substrate and is electrically isolated from the semiconductor substrate, the metal interconnection structure disposed on a first substrate surface of the semiconductor substrate; and forming a through-silicon via into the semiconductor substrate that contacts the metal pad from a second substrate surface of the semiconductor substrate and electrically connected to the metal pad, the second substrate surface opposite the first substrate surface.

BRIEF DESCRIPTION OF THE FIGURES

FIG. 8 is a flowchart illustrating a method for stabilizing through-silicon via connections in a semiconductor device.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
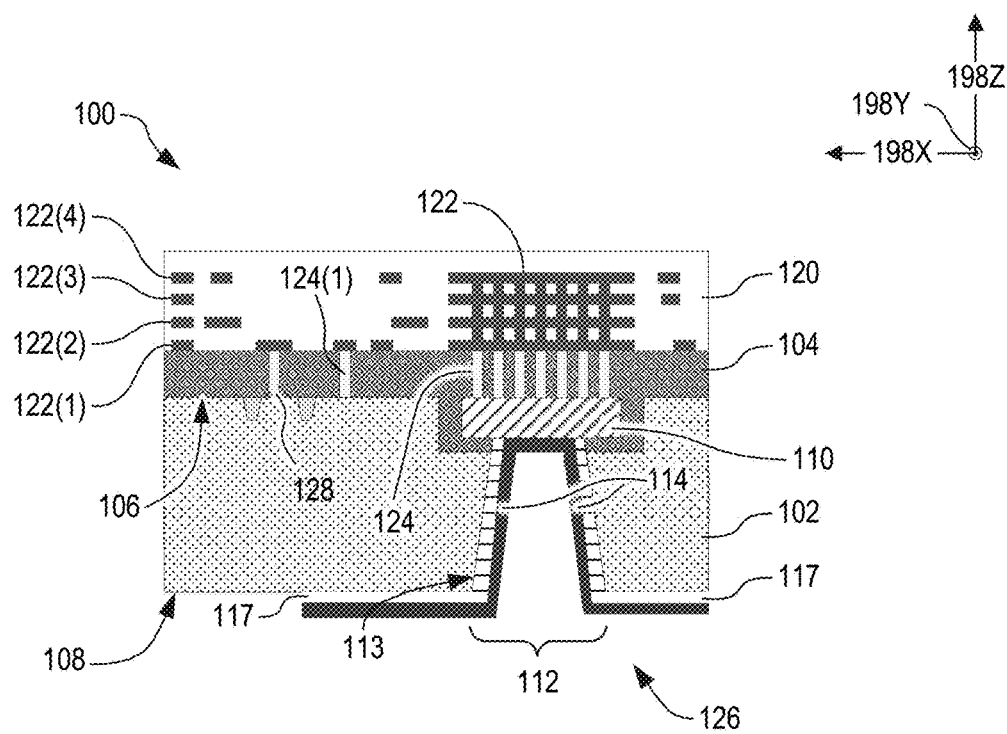
FIG. 1 is a schematic cross-sectional view of a semiconductor device that includes a metal pad that is connected to a metal interconnection structure, according to an embodiment.

FIG. 1 illustrates a cross-sectional side view of a semiconductor device 100 that includes a metal pad 110, which is connected to a metal interconnection structure 122. The cross section illustrated in FIG. 1 is parallel to a plane, hereinafter the x-z plane, formed by orthogonal axes 198X and 198Z, which are each orthogonal to an axis 198Y. A plane, hereinafter the x-y plane, formed by orthogonal axes 198X and 198Y, and planes parallel to the x-y plane are referred to as horizontal planes. Unless otherwise specified, heights of objects herein refer to the object's extent along axis 198Z. Herein, a reference to an axis x, y, or z refers to axes 198X, 198Y, and 198Z respectively. Also, herein, a width refers to an object's extent along they axis, a length refers to an object's extent along the x axis, a thickness (of thinness) refers to an object's extent along the z axis, and vertical refers to a direction along the z axis. Also, herein, above refers to a relative position a distance away along the axis 198Z in the positive direction and below refers to a relative position a distance away along the axis 198Z in the negative direction.

The semiconductor device 100 includes a semiconductor substrate 102 that includes a first substrate surface 106 and a second substrate surface 108 that is opposite the first substrate surface 106. Disposed on the first substrate surface 106 is an inter-layer dielectric layer 104. In an embodiment, the inter-layer dielectric layer 104 is formed of an oxide material, such silicon oxide. Above the inter-layer dielectric layer 104 is a low-κ dielectric layer (or low-κ inter-layer dielectric layer) 120 into which a metal interconnection structure (or multi-layer metal interconnection structure) 122 is embedded. In the embodiment of FIG. 1, the metal interconnection structure 122 is formed of four metal layers, a first metal layer 122(1), a second metal layer 122(2), a third metal layer 122(3) and a fourth metal layer 122(4). Each metal layer corresponds to portions of the metal interconnection structure at a given vertical position in the low-κ dielectric layer 120. For clarity of illustration, only one portion of each metal layer is indicated with a call out. Similarly, for clarity of illustration, not all parts of metal interconnection structure 122 are indicated by the call-out in FIG. 1. Elements within low-κ dielectric layer 120 with solid dark gray fill schematically represent part of the metal interconnection structure 122. The structure of metal interconnection structure 122 and components of each of metal layers (122(1), 122(2), 122(3), or 122(4)) are representative of a generic metal interconnection structure and are not meant to limit the embodiments described herein. More or fewer metal layers may be used without departing from the scope hereof. In the embodiment of FIG. 1, although not illustrated, the first metal layer 122(1) may be the thinnest metal layer among metal layers 122(1), 122(2), 122(3), or 122(4) and has a thickness of 800 to 2000 angstroms. In the embodiments, the fourth metal layer 122(4) may be the thickest metal layer among metal layers 122(1), 122(2), 122(3), or 122(4), and may have a thickness of 4000 to 8000 angstroms.

The metal interconnection structure 122 is electrically connected to a metal pad 110 by a set of conductive contacts 124, which are indicated individually as conductive contacts 124(1). The set of conductive contacts 124 is formed in inter-layer dielectric layer 104. Transistor gates 128 disposed on the first substrate surface 106 of semiconductor substrate 102 are also embedded in the inter-layer dielectric layer 104. The metal pad 110 may be surrounded by inter-layer dielectric layer 104 and isolated from the semiconductor substrate 102 by the inter-layer dielectric layer 104. In the embodiment of FIG. 1, multiple conductive contacts (not individually indicated) connect the metal pad 110 to the first metal layer 122(1) of the metal interconnection structure 122. Transistor gates 128 and source/drains of integrated circuit formed on semiconductor substrate 102 may be connected to the corresponding interconnection structure of metal interconnection structure 122 using respective conductive contact 124(1). It is appreciated that more or fewer conductive contacts 124(1) may be used for connecting different circuit components, such as transistor gates, source/drain regions, to respective interconnection structure of metal interconnection structure 122 without departing from the scope hereof. Although seven conductive contacts are employed in the example to couple metal interconnection structure 122 and metal pad 110, it is appreciated more or fewer conductive contacts 124 may be used to connect the metal pad 110 and the metal interconnection structure 122. For example, a single conductive contact 124 may be employed to electrically connect metal interconnection structure 122 to metal pad 110 and to provide sufficient separation between the metal pad 110 and the low-κ dielectric layer 120 to prevent exposure of low-κ dielectric layer 120 during fabrication process causing delamination. Conductive contacts 124 can have same or varying physical dimension e.g., length and/or width depending at least on the size of metal pad 110 and number of conductive contacts 124 employed. In an embodiment, the number of conductive contacts 124 employed and associated physical dimension may also be configured based on mechanical strength required to provide support to between metal pad 110 and metal interconnection structure 122 during the formation of through silicon via for process reliability.

The semiconductor substrate 102 forms an opening 112 that extends from the second substrate surface 108 through the semiconductor substrate 102 to the metal pad 110. The metal pad 110 is electrically isolated from the semiconductor substrate 102. In the embodiment illustrated in FIG. 1, the metal pad 110 is electrically isolated from the semiconductor substrate 102 by an insulating layer, wherein the insulating layer may be formed of the same material that forms the inter-layer dielectric layer 104. The semiconductor substrate 102 has a surface 113 of the semiconductor substrate 102 that forms the opening 112. In an embodiment, the surface 113 of the semiconductor substrate 102 that forms the opening 112 is lined with an insulating liner layer 117 onto which a conductive layer 114 is formed. The conductive layer 114 is electrically connected to the metal pad 110 allowing electrical connection forming a through-silicon via 126 allowing electrically connection formed between the metal interconnection structure 122 and an external circuit (e.g., external circuit board). The insulating liner layer 117 and the conductive layer 114 may extended onto and along the second substrate surface 108. A solder or conduction ball (not shown) may be formed on a portion of conductive layer 114 that is on the second substrate surface 108 for forming electrical connection with an external circuit.

Figure 2:
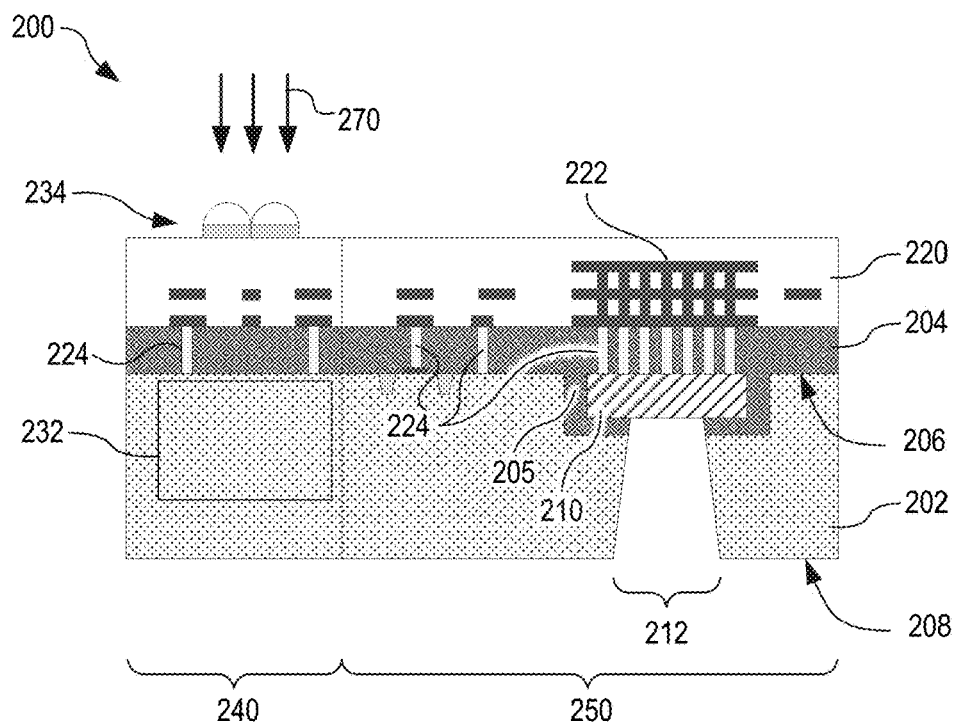
FIG. 2 is a schematic cross-sectional view of a semiconductor device of FIG. 1 that includes an image sensor, according to an embodiment.

FIG. 2 illustrates a cross-sectional side view of a semiconductor device 200 that is a non-stacking structure and includes a metal pad 210 for providing mechanical support to formation of through-silicon via. The semiconductor device 200 includes a semiconductor substrate 202 that includes a first substrate surface 206 and a second substrate surface 208 that is opposite the first substrate surface 206. The semiconductor substrate 202 includes an optically active region 240 and a periphery region 250. In an example, the periphery region 250 may surround the optically active region 240. Disposed on the first substrate surface 206 is an inter-layer dielectric layer 204. Above the inter-layer dielectric layer 204 is a low-κ dielectric layer (low-κ inter-layer dielectric layer) 220 into which a metal interconnection structure 222 is embedded. The metal interconnection structure 222 is electrically connected to the metal pad 210 by a set of conductive contacts 224. Although three layers of metal interconnection structure 222 are illustrated in FIG. 2, it is appreciated that more or fewer metal layers may be used without departing from the scope hereof. The first metal layer (or the bottom metal layer) of metal interconnection structure 222 may be the thinnest metal layer among the three metal layers. The semiconductor substrate 202 forms an opening 212 compatible with a through-silicon via (not shown) that extends from the second substrate surface 208 to the metal pad 210. The metal pad 210 is electrically isolated from the semiconductor substrate 202. In an embodiment illustrated in FIG. 2, the metal pad 210 is electrically isolated from the semiconductor substrate 202 by an insulating layer 205, wherein the insulating layer 205 may be formed with the same material that forms the inter-layer dielectric layer 204, for example silicon oxide. The metal pad 210 reinforces structural strength and provides mechanical support to buffer stress induced during the formation of through silicon via, thereby improves processing reliability. The semiconductor device 200 may be an image sensor that includes a photodiode (pixel) array 232 and an optics layer 234 arranged in the optically active region 240. In the embodiment illustrate in FIG. 2, the image sensor is a frontside illuminated (FSI) sensor and incoming light 270 is directed to the photodiode array 232 by the optical layer 234 through the first substrate surface 206 (e.g., front side). The semiconductor device 200, semiconductor substrate 202, inter-layer dielectric layer 204, first substrate surface 206, second substrate surface 208, metal pad 210, opening 212, low-κ dielectric layer 220, metal interconnection structure 222, and conductive contacts 224 are examples of semiconductor device 100, semiconductor substrate 102, inter-layer dielectric layer 104, first substrate surface 106, second substrate surface 108, metal pad 110, opening 112, low-κ dielectric layer 120, metal interconnection structure 122, and conductive contacts 124 of FIG. 1, respectively, and descriptions of elements from FIG. 1 apply to the respective elements of FIG. 2.

Figure 3:
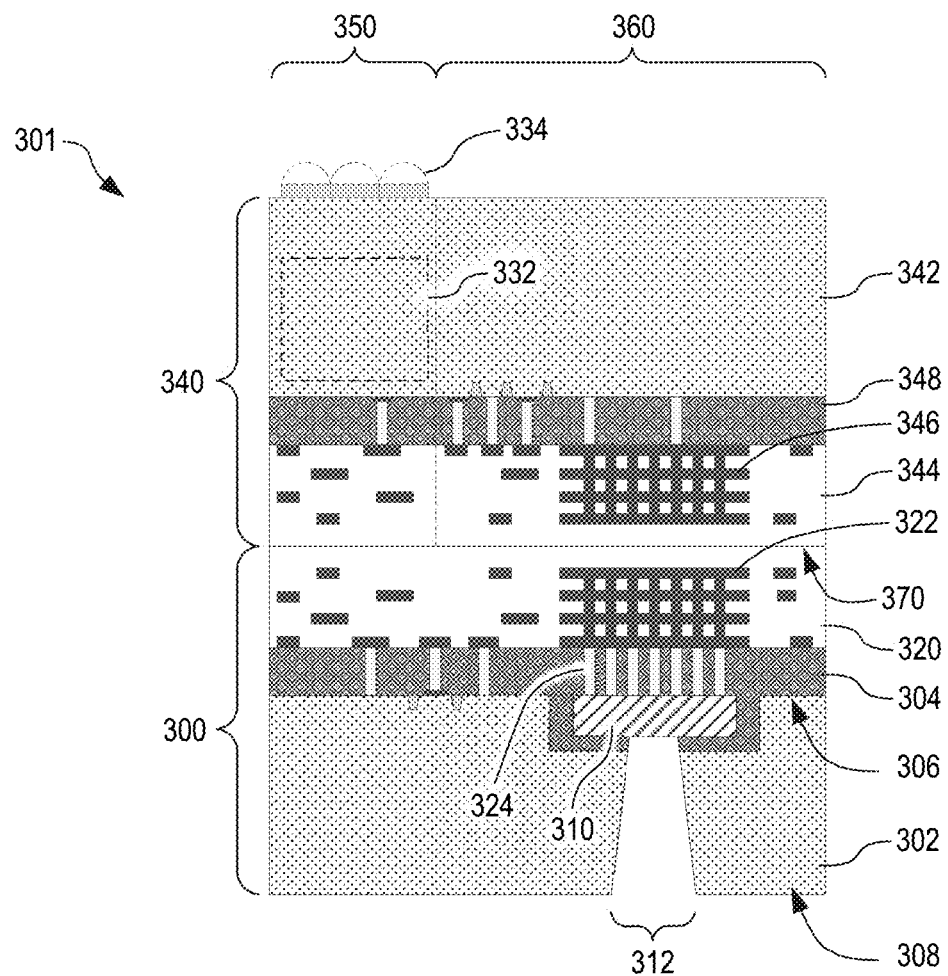
FIG. 3 is a schematic cross-sectional view of a chip-scale package of FIG. 1 that includes an integrated circuit, according to an embodiment.

FIG. 3 illustrates a cross-sectional side view of a chip-scale package 301 that includes a first semiconductor device 300 and a second semiconductor device 340. In an example, the first semiconductor device 300 has an integrated circuit formed therein. In an example, the first semiconductor device 300 is an application specific integrated circuit (ASIC) device. In an example, the second semiconductor device 340 is an image sensor, such as a backside illuminated image sensor. In an embodiment, the first semiconductor device 300 is implemented on a first die or wafer, and the second semiconductor device 340 is implemented on a second die or wafer. The first semiconductor device 300 includes a first semiconductor substrate 302 that includes a first substrate surface 306 and a second substrate surface 308 that is opposite the first substrate surface 306. Disposed on the first substrate surface 306 is an inter-layer dielectric layer 304, formed of dielectric material such as silicon oxide. Above the inter-layer dielectric layer 304 is a low-κ dielectric layer 320 into which a single or multi-layer metal interconnection structure (no reference number indicated to aid in visual clarity) is embedded. A first metal interconnection structure 322 is electrically connected to a metal pad 310 by a set of conductive contacts 324 formed and embedded in the inter-layer dielectric layer 304. The first semiconductor substrate 302 of the first semiconductor device 300 forms an opening 312 that extends from the second substrate surface 308 to the metal pad 310. The opening 312 may expose a surface (e.g., lower surface) of the metal pad 310. In embodiments, the opening 312 is used for forming a through silicon via similar to through-silicon via 126 of FIG. 1, for example, having conductive layer (not shown) deposited therein for forming connection between first metal interconnection structure 322 and external circuit through metal pad 310 and insulating liner layer isolating the conductive layer and first semiconductor substrate 302. In embodiments, the metal pad 310 is disposed not in contact with the first semiconductor substrate 302. In embodiments, the metal pad 310 is spaced from the first semiconductor substrate 302, for example there exist a gap between metal pad 310 and the first semiconductor substrate 302. The metal pad 310 is electrically isolated from the first semiconductor substrate 302. In an embodiment, the metal pad 310 is electrically isolated from the first semiconductor substrate 302 by an insulating layer and surrounded by the insulating layer wherein the insulation layer may be formed with the same material that forms the inter-layer dielectric layer 304. In an embodiment, the metal pad 310 is surrounded by and submerged in the first semiconductor substrate 302 by the insulating layer and the inter-layer dielectric layer 304. Attached to the first semiconductor device 300 is the second semiconductor device 340, which includes a second semiconductor substrate 342, a second low-κ (inter-layer) dielectric layer 344, a second metal interconnection structure 346 embedded within the second low-κ dielectric layer 344, and a second inter-layer dielectric layer 348. The second low-κ dielectric layer 344 of the second semiconductor device 340 is bonded to the low-κ dielectric layer 320 of the first semiconductor device 300 by oxide bonding or hybrid bonding process. The first semiconductor device 300 is electrically connected to the second semiconductor device 340 through an electric connection for example one or more metal bonding pads (not shown). In an embodiment, the second semiconductor device 340 is electrically connected to the first semiconductor device 300 through electrical connection between the second metal interconnection structure 346 and the first metal interconnection structure 322 (not indicated). In an embodiment, the second metal interconnection structure 346 is electrically connected to the first metal interconnection structure 322 through a bonding interface 370 between the first semiconductor device 300 and the second semiconductor device 340. Other electrical connections between the second semiconductor device 340 and the first semiconductor device 300 do not depart from the scope hereof.

In an embodiment, the second semiconductor device 340 is an image sensor and the second semiconductor substrate 342 has an optical action region 350 and a periphery region 360. The optical action region 350 of the second semiconductor substrate 342 includes a photodiode array 332 and an optics layer 334. The image sensor may be a backside illuminated (BSI) image sensor.

The first semiconductor device 300, first semiconductor substrate 302, inter-layer dielectric layer 304, first substrate surface 306, second substrate surface 308, metal pad 310, opening 312, low-κ dielectric layer 320, first metal interconnection structure 322, and conductive contact 324 are examples of semiconductor device 100, semiconductor substrate 102, inter-layer dielectric layer 104, first substrate surface 106, second substrate surface 108, metal pad 110, opening 112, low-κ dielectric layer 120, metal interconnection structure 122, and conductive contact 124 of FIG. 1, respectively, and descriptions of elements from FIG. 1 apply to the respective elements of FIG. 3. The optics layer 334, and photodiode array 332 of image sensor in FIG. 3 are examples of optics layer 234, and photodiode array 232 of the image sensor in FIG. 2, respectively, and descriptions of elements from FIG. 2 apply to the respective elements of FIG. 3.

Figure 4:
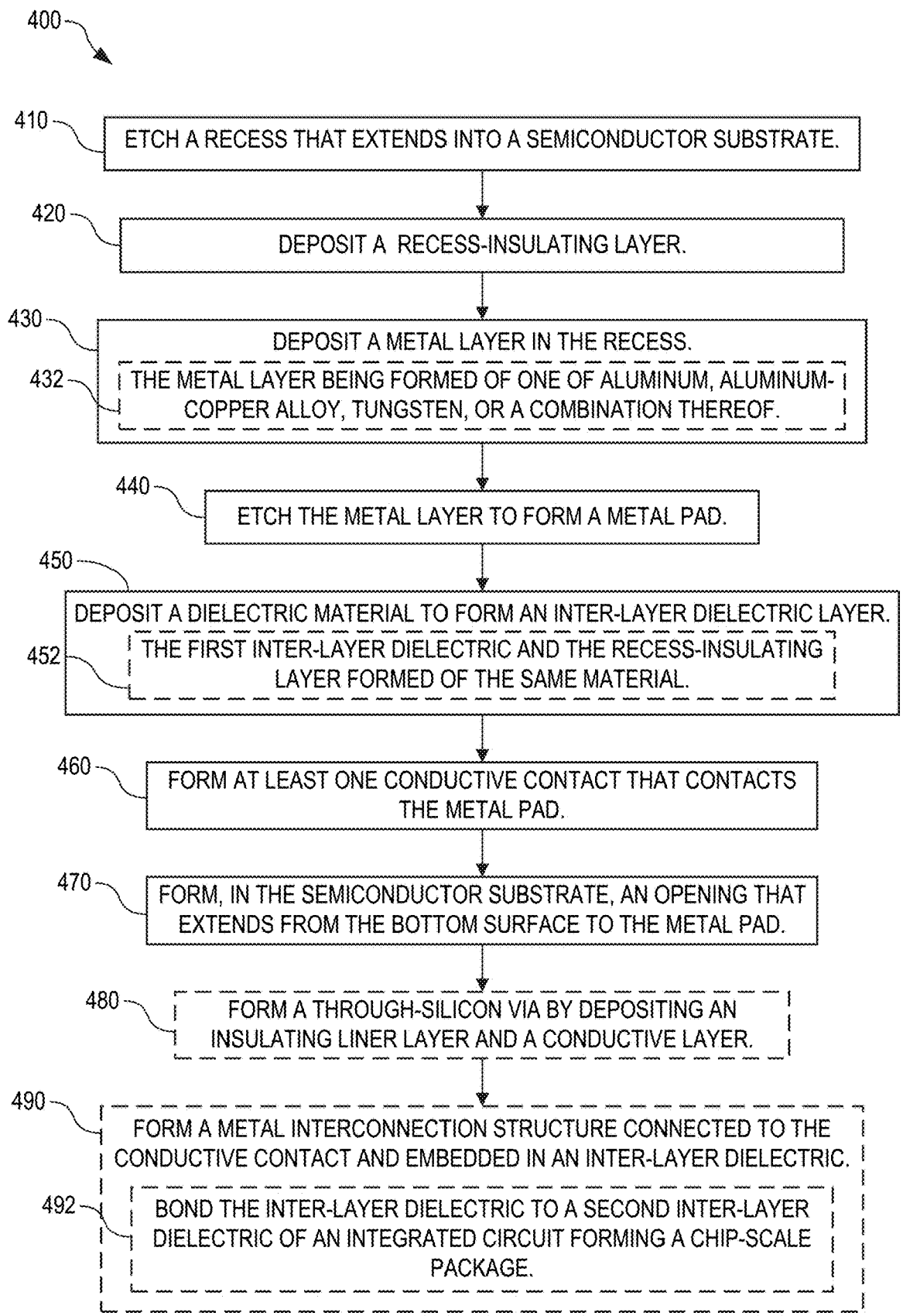
FIG. 4 is a flowchart illustrating a method for manufacturing a semiconductor device of FIG. 1 with a metal pad for increased mechanical stability, according to an embodiment.
Figure 6:
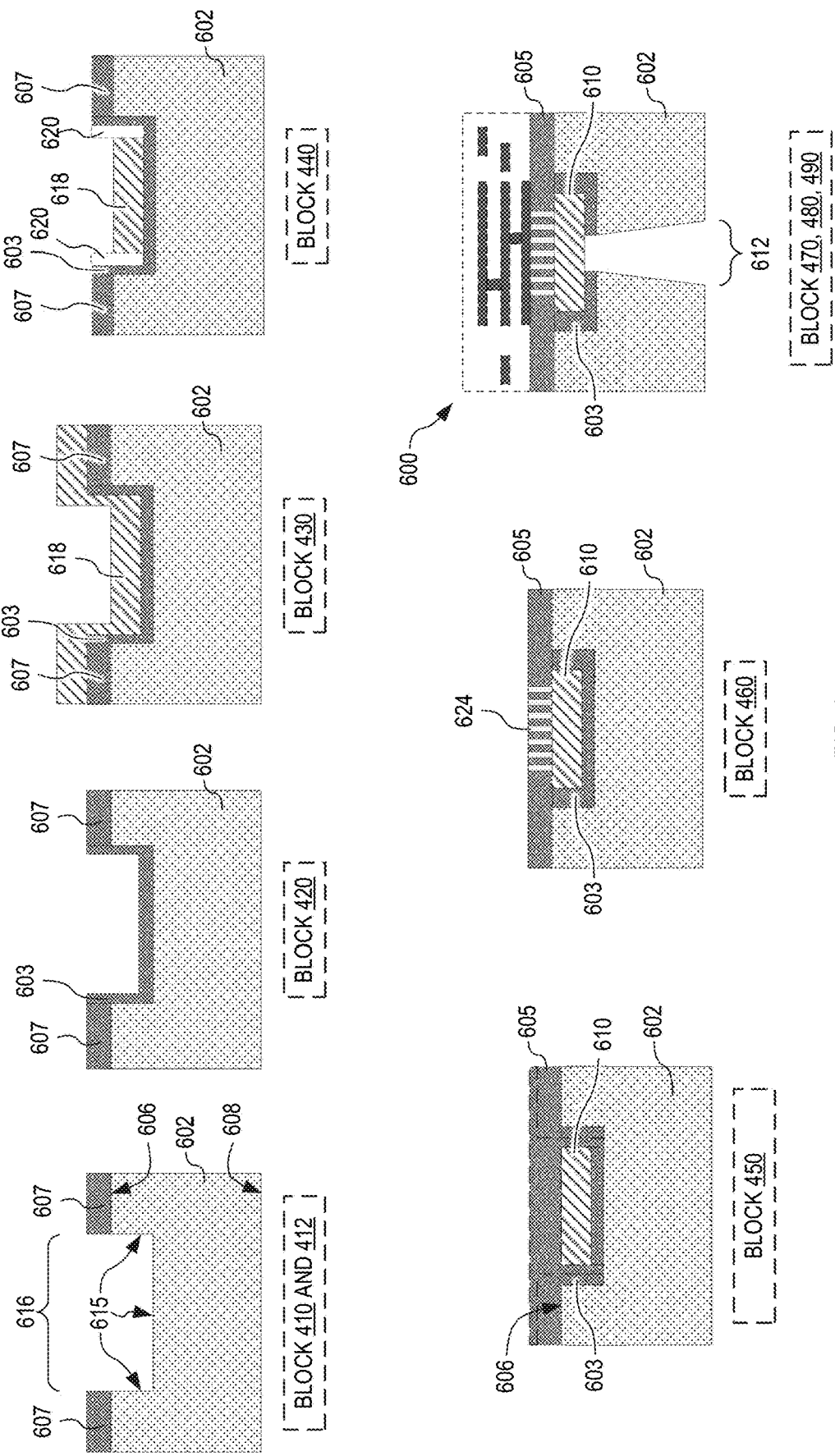
FIG. 6 shows a second series of schematic cross-sectional views of a semiconductor device to illustrate the method of FIG. 4, according to an embodiment.
Figure 7:
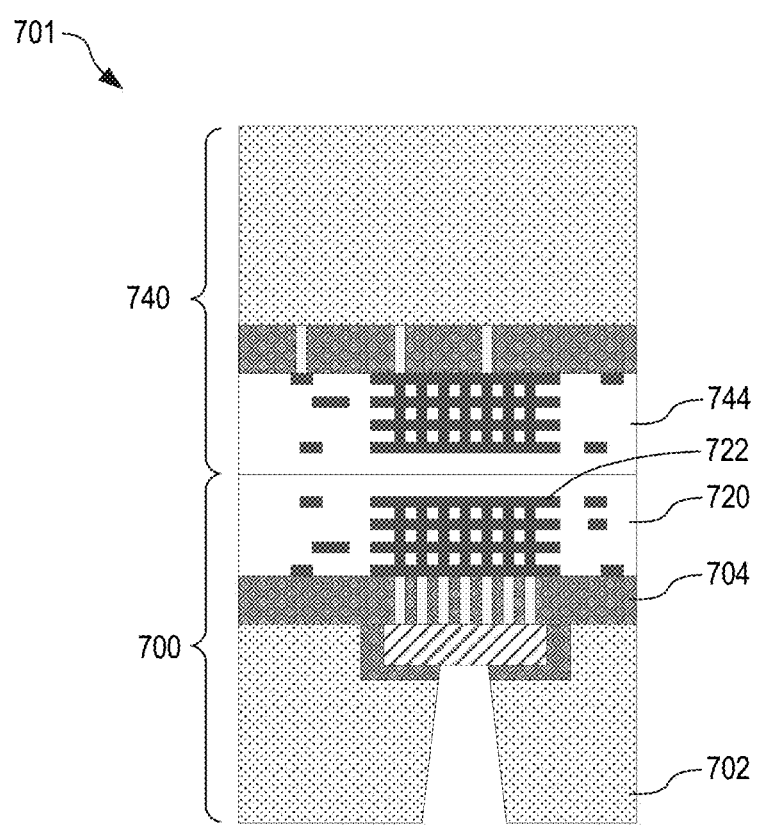
FIG. 7 is a schematic cross-sectional view of a chip-scale package of semiconductor device, according to an embodiment.

FIG. 4 is a flowchart illustrating a method 400 for manufacturing a chip scale structure with a metal pad for increased mechanical stability through reducing stress exerted onto first metal layer during through-silicon via formation. Method 400 may be part of the fabrication method used to form any of semiconductor devices 100, 200, or 300. Method 400 includes at least one of blocks 410, 420, 430, 440, 450, 460, and 470. In embodiments, method 400 also includes blocks 412, 432, 452, 480, 490, and 492. Examples of the blocks of method 400 are illustrated in FIGS. 5, 6, and 7.

In block 410 of method 400, a recess is etched a depth into the first substrate surface of a semiconductor substrate. The semiconductor substrate has a second substrate surface that is opposite the first substrate surface. In an embodiment, the recess is etched using a first mask. In block 420 of method 400, a recess-insulating layer is deposited that coats a semiconductor substrate surface that forms the recess. In an embodiment, the recess-insulating layer is deposited with chemical vapor deposition. In block 430 of method 400, a metal layer is deposited into the recess, wherein the metal layer is electrically insulated from the semiconductor substrate by the recess-insulating layer. In an embodiment, the metal layer is deposited such that it coats the recess to a thickness that causes top of the metal layer within the recess to be substantially coplanar with the top surface of the semiconductor substrate. This process also deposits metallic material of metal layer on the sidewalls of the recess. In block 440 of method 400, an excess portion of the metal layer is removed to form a metal pad. In an embodiment, block 440 includes etching to form a metal pad that has a top surface that is coplanar with the first substrate surface to within a tolerance (e.g., +/−10 nm). The size of metal pad may be adjusted through configuring the size of recess or the thickness of the recess-insulating layer. In an embodiment, the etching is done using a second mask. The etching process removes metallic material of metal layer from the surface of the semiconductor substrate and the sidewalls of the recess, leaving a gap between the recesses-insulating layer and the metal pad. The second mask can be used to control the width of the metal pad. In block 450 of method 400, a dielectric material, such as oxide material, is deposited to form an inter-layer dielectric layer that covers the first substrate surface and the top surface of the metal pad embedding the metal pad in the semiconductor substrate. The recess-insulating layer may be formed of the same material as the inter-layer dielectric layer. The recess-insulating layer provides isolation between the semiconductor substrate and the metal pad preventing metal diffusion. In block 460 of method 400, at least one conductive contact is formed that extends through the inter-layer dielectric layer and contacts the metal pad, the conductive contact formed by photolithography, etching and metal deposition. In one embodiment, the set of conductive contacts is formed by first etching through the inter-layer dielectric layer forming respective one or more contact holes on the inter-layer dielectric layer landing on the metal pad, and deposit metal material e.g., tungsten, aluminum into the respective contact hole(s). In block 470 of method 400, an opening or a hole is formed in the semiconductor substrate that extends from the second substrate surface to the metal pad. Block 470 also includes removing material from the recess-insulating layer such that the opening terminates at the metal pad and expose a lower surface opposite to the top surface of the metal pad. In one example of blocks 410, 420, 430, 440, 450, 460, and 470, the metal pad is formed into the semiconductor substrate. The inter-layer dielectric layer electrically insulates the metal pad from the semiconductor substrate and also covers the first substrate surface and the metal pad. The opening formed into the semiconductor substrate extends from the second substrate surface to the metal pad.

Figure 5:
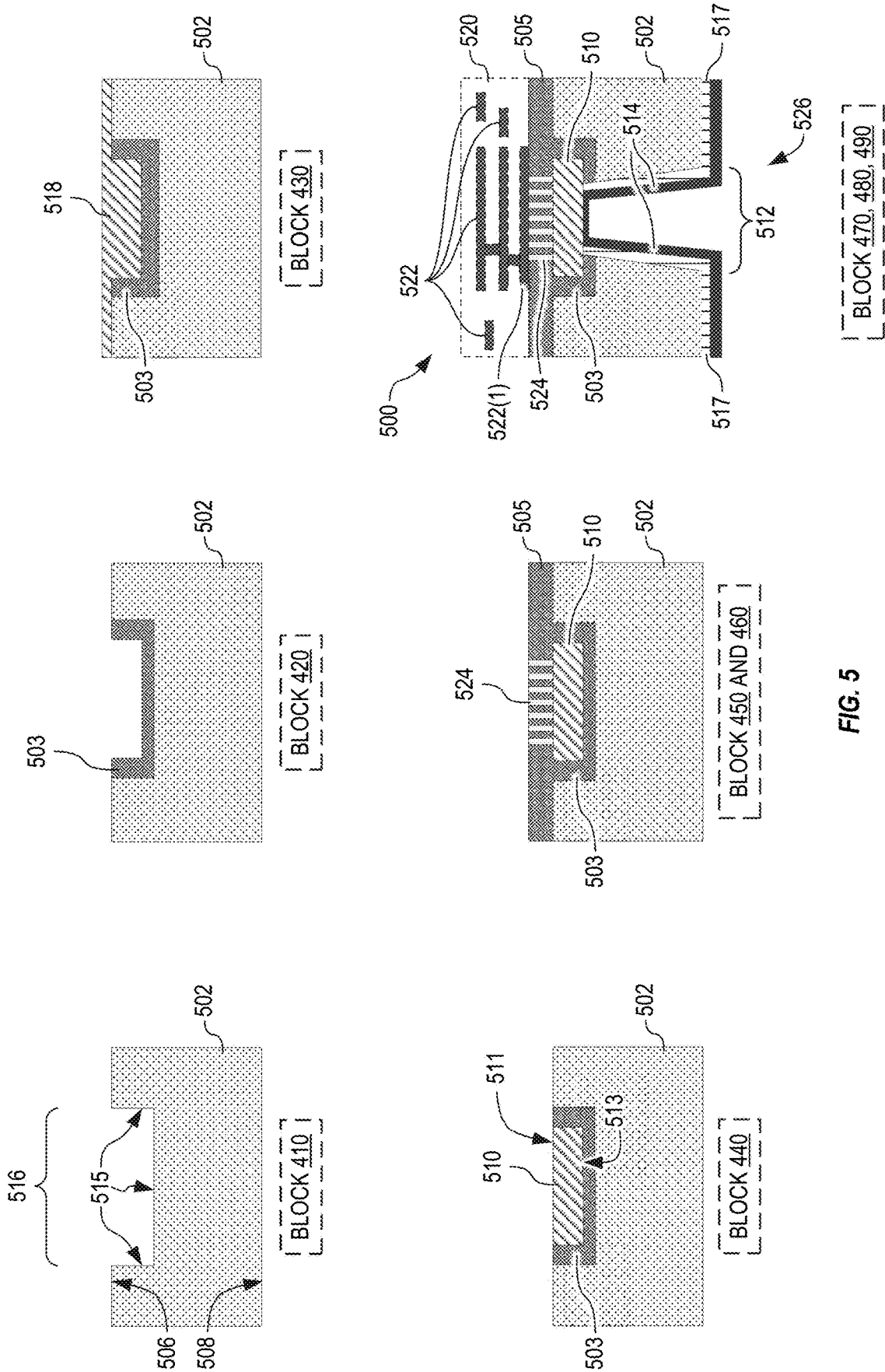
FIG. 5 shows a first series of cross-sectional views of a semiconductor device to illustrate the method of FIG. 4, according to an embodiment.

FIG. 5 shows a series of cross-sectional views of a semiconductor device 500, which illustrate blocks 410, 420, 430, 440, 450, 460, and 470 of method 400. Using block 410, a recess 516 is etched a depth into the first substrate surface 506 (e.g., front surface) of a semiconductor substrate 502. The semiconductor substrate 502 has a second substrate surface 508 (e.g., back surface) that is opposite the first substrate surface 506. The semiconductor substrate 502 may be a semi-fabricated substrate, for example having one or more circuit components for an integrated circuit already formed therein wherein the integrated circuit includes at least one transistor and/or memory. In an embodiment, the recess 516 has a vertical extent that may be determined based on the desire thickness of later-formed metal pad. Using block 420 of method 400, a recess-insulating layer 503 is deposited that coats a semiconductor substrate surface 515 that forms the recess 516. In one example, the thickness of recess-insulating layer 503 may be configured to define a size of the metal pad. The size of metal pad is configured to provide sufficient mechanical support to first metal layer (e.g., first metal layer 522(1)) of multi-layer interconnect structure during the formation of through-silicon via structure. Although three layers of metal interconnection structure 522 is illustrated in FIG. 5 for simplicity, it is appreciated that more or fewer metal layers may be used without departing from the scope hereof. The hole for the through-silicon via formed by etching through the semiconductor substrate 502 lands on the metal pad instead on the thin first metal layer 522(1) reduces mechanical stress induced, thereby improves reliability. In an embodiment, the recess-insulating layer 503 has a thickness that ranges from hundreds of angstroms to micrometers. The recess-insulating layer 503 may be formed of silicon oxide. Using block 430 of method 400, a metal material is deposited into the recess 516, for example by a chemical vapor deposition, forming a metal layer 518. The metal layer 518 is deposited with sufficient deposited thickness such that an inner planar surface (or inner bottom surface) is levelled with first substrate surface 506 of semiconductor substrate 502. In an example, the metal layer 518 is deposited coated on recess-insulating layer 503 forming a U-shaped cavity. The metal layer 518 electrically insulated from the semiconductor substrate 502 by the recess-insulating layer 503. Using block 440 of method 400, the metal layer 518 is etched removing portions of metal layer 518 to form a metal pad 510 that has a top surface 511 that is substantially coplanar with the first substrate surface 506 to within a tolerance (e.g., +/−10 nm). In an embodiment, the metal layer 518 is etched to form a metal pad 510 that has a top surface 511 that is above the first substrate surface 506. In an embodiment, the metal layer 518 is etched to form a metal pad 510 that has a top surface 511 that is below the first substrate surface 506. The vertical position of the top surface 511 relative to the vertical position of the first substrate surface 506 may vary without departing from the scope hereof.

Using block 450 of method 400, a dielectric material, such as oxide material is deposited to form an inter-layer dielectric layer 505 that covers the first substrate surface 506 and the top surface 511 of the metal pad 510. During the etching process, gaps may be formed between the sides of metal pad 510 and the recess-insulating layer 503, and in block 450 of depositing dielectric material fill into the gaps. In an embodiment of block 450, the recess-insulating layer 503 and the inter-layer dielectric layer 505 is deposited such that metal pad 510 is embedded or submerged in the semiconductor substrate 502. The dielectric material may be formed of the same material as of recess-insulating layer 503. Using block 460 of method 400, a set of conductive contacts 524 is formed that extends through the inter-layer dielectric layer 505 and landed on the metal pad 510, for example by lithography and metal deposition processes. The number of conductive contacts 524 formed can be determined based on size of metal pad 510 and minimum design rule. In embodiments, the conductive contacts 524 may be equally spaced, and the spacing between adjacent conductive contacts 524 can be configured based on the minimum design rule. In an embodiment, the set of conductive contacts 524 comprise of a single conductive contact with width thereof adjusted based on the size of metal pad 510 to provide sufficient mechanical support in the region between metal pad 510 and the metal interconnection structure 522. In an embodiment, the set of conductive contacts is formed during the same fabrication step as other conductive contacts formed to connect the respective transistor gates and/or sources/drains formed on the first substrate surface 506 of the semiconductor substrate 502 to the corresponding metal interconnects of metal interconnection structure 522, which are known in the art. The conductive contacts may comprise of metallic material such as aluminum or tungsten. Using block 470 of method 400, an opening 512 for a through-silicon via is formed in the semiconductor substrate 502 that extends from the second substrate surface 508 to a lower surface 513 of the metal pad 510. Block 470 also includes removing material from the recess-insulating layer 503 to expose the lower surface 513 of the metal pad 510.

In embodiments, the width of the opening 512 is at least in part determined by the width of an intended TSV that may be formed into the semiconductor device 500. The width of the opening 512 also, at least in part, determines the width of the metal pad 510 and subsequently the width of the recess 516 formed in block 410. In embodiments, the metal pad 510 has a width larger than the width of the opening 512 and, subsequently, the recess 516 has a width larger than the width of the metal pad 510, by at least the 400 angstroms for example, which provides sufficient available space for the recess-insulating layer 503 on each side of the metal pad 510.

The semiconductor device 500, semiconductor substrate 502, first substrate surface 506, second substrate surface 508, metal pad 510, opening 512, conductive layer 514, insulating liner layer 517, low-κ dielectric layer 520, metal interconnection structure 522, conductive contacts 524, and a through-silicon via 526 (described below) are examples of semiconductor device 100, semiconductor substrate 102, first substrate surface 106, second substrate surface 108, metal pad 110, opening 112, conductive layer 114, insulating liner layer 117, low-κ dielectric layer 120, metal interconnection structure 122, conductive contacts 124, and through-silicon via 126 of FIG. 1, respectively, and descriptions of elements from FIG. 1 apply to the respective elements of FIG. 5.

Method 400, specifically block 470, has a particular advantage over conventional through-silicon via fabrication techniques. Compared to openings formed for conventional through-silicon vias that do not make use of metal pads, the formation of the opening used in block 470 provides a key advantage. Conventionally, openings are formed to contact the first thin metal layer of metal interconnection structure, for example, first metal layer 122(1) of the metal interconnection structure 122, which is thinner than the metal pad. During removal of material to form the opening, the tolerance for depth of the opening is dictated by the thickness of the material to which the through-silicon via will be contacted. In order to produce thinner semiconductor device structure, it is advantageous to reduce the thickness of each metal layer of metal interconnection structures, which can reduce the thickness of the inter-layer dielectric layer as well as reduce the fabrication time and cost since less material is deposited. As a result, the first metal layer of the metal interconnection may be as thin 800 angstroms. By forming the opening for a through-silicon via that terminates at a metal pad rather than directly to the metal interconnection structure relieving etching stress induced, the manufacturing tolerances of the process are relaxed. In an embodiment, the metal pad 510 has a thickness of 1,000 angstroms to 20,000 angstroms. This makes formation of the opening 512 relatively simpler than forming openings for conventional through-silicon vias that contact the metal interconnection structure directly. The metal pad 510 may be thicker or thinner without departing from the scope hereof. In an embodiment, the width of metal pad 510 is larger than the width of the opening 512. In general, the width of the metal pad is dictated by the width of the desired TSV and the width of metal interconnection structure to which it will be in contact. The metal pad 510 may be wider or narrower with respect to the opening 512 without departing from the scope hereof.

FIG. 6 shows a series of cross-sectional views of a semiconductor device 600 that illustrate block an example of 412 as well as an example of blocks 410, 420, 430, 440, 450, 460, 470, 480, and 490 of the method 400. Using block 410 a recess 616 is etched into the first substrate surface 606 of a semiconductor substrate 602. The semiconductor substrate has a second substrate surface 608 that is opposite the first substrate surface. The semiconductor substrate 602 is coated on the first substrate surface 606 with a first inter-layer dielectric layer 607, which is formed of the same material as inter-layer dielectric layer 605 formed in block 450, described below. The semiconductor substrate 602 may be a semi-fabricated substrate, for example having one or more circuit components for an integrated circuit already formed therein wherein the integrated circuit includes at least one transistor and/or memory.

Using block 420 of method 400, a recess-insulating layer 603, such as oxide material, is deposited that coats a semiconductor substrate surface 615 that forms the recess 616. The recess-insulating layer 603 lines the inner surfaces of recess 616 conformally. Using block 430 of method 400, a metal material is deposited into the recess 616 to form a metal layer 618 that is electrically insulated from the semiconductor substrate 602 by the recess-insulating layer 603. Using block 440 of method 400, the metal layer 618 is etched to form a metal pad 610 that has a top surface 611 that is coplanar with the first substrate surface 606 to within a tolerance (e.g., +/−10 nm). In an embodiment, the metal layer 618 is etched by using a mask for the metal pad 610. The etching process removes metal layer from the surface of the semiconductor substrate and the sidewalls of the recess, leaving gaps 620 between the recesses-insulating layer 603 and the metal pad 610. Using block 450 of method 400, a dielectric material e.g., oxide material is deposited on the first inter-layer dielectric layer 607, metal pad 610, and into the recess 616 filling gaps 620 to form an inter-layer dielectric layer 605 that covers the first substrate surface 606 and the top surface 611 of the metal pad 610. Using block 460 of method 400, a set of conductive contacts 624 is formed that extends through the inter-layer dielectric layer 605 and contacts the metal pad 610. Using block 470 of method 400, an opening 612 is formed in the semiconductor substrate 602 that extends from the second substrate surface 608 to the metal pad 610. Block 470 also includes removing material from the recess-insulating layer 603. The semiconductor device 600, semiconductor substrate 602, first substrate surface 606, second substrate surface 608, metal pad 610, opening 612, and conductive contacts 624 are examples of semiconductor device 100, semiconductor substrate 102, first substrate surface 106, second substrate surface 108, metal pad 110, opening 112, and conductive contacts 124 of FIG. 1, respectively, and descriptions of elements from FIG. 1 apply to the respective elements of FIG. 6.

In certain embodiments, the method 400 includes one or more additional blocks of the flowchart in FIG. 4. In block 432 of method 400, the metal layer of block 430 is formed of one of aluminum, aluminum-copper alloy, tungsten, or a combination thereof. In examples of block 423, any of metal pads 110, 210, 310, 510, or 610 may be formed of aluminum, aluminum-copper alloy, tungsten, or a combination thereof.

In certain embodiments, the method 400 includes one or more additional blocks of the flowchart in FIG. 4. In block 452 of method 400, the inter-layer dielectric layer formed in block 450 and the recess-insulating layer formed in block 420 are formed of the same material. In examples of block 452, the recess-insulating layer 503/603 and the inter-layer dielectric layer 505/605 are formed of the same material FIG. 7 illustrates a cross-sectional side view of a chip-scale package 701 that includes a first semiconductor device 700 and a second semiconductor device having an integrated circuit formed bonded together, wherein the integrated circuit may include at least one transistor and/or memory (not shown). FIG. 7 illustrates one example of block 452, that is, the recess-insulating layer 703 and the inter-layer dielectric layer 704 are formed of the same material, such as oxide material. The boundary between the two is shown in dotted lines since the two can be considered together an inter-layer dielectric layer 704. The first semiconductor device 700, semiconductor substrate 702, inter-layer dielectric layer 704, first metal interconnection structure 722, and a low-κ (inter-layer) dielectric layer 720 are examples of the semiconductor device 100, semiconductor substrate 102, inter-layer dielectric layer 104, metal interconnection structure 122, and low-κ dielectric layer 120 of FIG. 1, respectively, and descriptions of elements from FIG. 1 apply to the respective elements of FIG. 7. The chip-scale package 701, second semiconductor device 740, and a second inter-layer dielectric 744 having a second metal interconnection structure embedded therein (described below) are examples of chip-scale package 301, second semiconductor device 340, and second low-κ dielectric layer 344 of FIG. 3, respectively, and descriptions of elements from FIG. 3 apply to the respective elements of FIG. 7.

In certain embodiments, the method 400 includes one or more additional blocks of the flowchart in FIG. 4. In block 480 of method 400, a through-silicon via is formed by depositing an insulating liner layer on the surface of the semiconductor substrate that forms the opening and a conductive layer on the insulating liner layer. The conductive layer is deposited onto the metal pad to electrically connect the metal interconnection structure 522 to the through-silicon via. In an example of block 480, the insulating liner layer 117 and the conductive layer 114 have been deposited on the surface 113 of the semiconductor substrate 102 that forms the opening 112, forming the through-silicon via 126.

FIG. 5 illustrates one example of block 480. Using block 480, a through-silicon via 526 is formed depositing an insulating liner layer 517 on a surface of the semiconductor substrate that forms the opening 512 and depositing a conductive layer 514 on the insulating liner layer 517. In embodiments, the insulating liner layer 517 is deposited into opening 512 lining the sidewall surface of opening 512 conformally. Another etching may be formed to remove a portion of insulating liner layer 517 to re-expose the lower surface 513 of the metal pad 510. The conductive layer 514 is deposited into opening 512 on the insulating liner layer 517 and electrically connected to the metal pad 510. The conductive layer 514 is isolated from the semiconductor substrate 502 by the insulating liner layer 517.

FIG. 5 illustrates one example of a through-silicon via that results from block 480. The through-silicon via 526 is formed using block 480 by depositing an insulating layer on the surface of the semiconductor substrate 502 that forms the opening 512 and a conductive layer 514 on the insulating layer.

In certain embodiments, the method 400 includes one or more additional blocks of the flowchart in FIG. 4. In block 490 of method 400, a metal interconnection structure is formed in an inter-layer dielectric. The metal interconnection structure is electrically connected to the conductive contract. In an example of block 490, the metal interconnection structure 122 is embedded in the low-κ dielectric layer 120 and is electrically connected to the metal pad 110. In embodiments, block 490 is processed prior to the block 480 of forming through silicon via.

FIG. 5 illustrates one example of block 490. Using block 490, the metal interconnection structure 522 is embedded in a low-κ dielectric layer 520 and is electrically connected to the conductive contacts 524.

In certain embodiments, the method 400 includes one or more additional blocks of the flowchart in FIG. 4. In block 492 of method 400, the inter-layer dielectric is bound to a second inter-layer dielectric of an integrated circuit forming a chip-scale package. In an example of block 492, the low-κ dielectric layer 320 is bound to the second low-κ dielectric layer 344 of second semiconductor device 340 to form the chip-scale package 301.

FIG. 7 illustrates one example of block 492. Using block 492, the low-κ (inter-layer) dielectric layer 720 of first semiconductor device 700 is bonded to the second inter-layer dielectric 744 of the second semiconductor device 740 for example by oxide or hybrid bonding process, which forms the chip-scale package 701. The first metal interconnection structure 722 of the first semiconductor device 700 may be electrically connected to the metal interconnection structure of the second semiconductor device 740, for example by metal bonding pads (not illustrated) at bonding interface to electrically connect the first semiconductor device 700 and the second semiconductor device 740.

Since the method 400 may be used in the semiconductor devices 100, 200, 300 described previously, the description of respective components of semiconductor devices 100, 200, 300 discussed above with respect to FIGS. 1-3 applies to those elements of method 400 with like names. Furthermore, method 400 is not limited, unless otherwise specified or understood by those of ordinary skill in the art, to the order shown in FIG. 4.

FIG. 8 is a flowchart illustrating a method 800 for stabilizing through-silicon via connections in semiconductor device structures. Method 800 may be part of a fabrication method used to form any of the semiconductor devices 100, 200, 300, 500, 600, or 700 as well as with second semiconductor devices 340 or 740. The method 800 includes blocks 810 and 820. In embodiments, the method 800 also includes at least block 812.

In block 810 of method 800, a metal interconnection structure is electrically connected to a metal pad that is submerged in a semiconductor substrate. The metal pad is electrically isolated from the semiconductor substrate by insulation layer. The metal interconnection structure is disposed on a first substrate surface of the semiconductor substrate. In examples of block 810, the metal interconnection structures 122, 222, and 522, are electrically connected to metal pads 110, 210, and 510, respectively, that are submerged in semiconductor substrates 102, 202, and 502, respectively. The metal pads 110, 210, and 510 are electrically isolated from the semiconductor substrates 102, 202, and 502, respectively. The metal interconnection structures 122, 222, and 522 are disposed on the first substrate surfaces 106, 206, and 506, respectively, of semiconductor substrates 102, 202, and 502, respectively.

In block 820 of method 800, a through-silicon via is formed in the semiconductor substrate and lands on the metal pad from a second substrate surface of the semiconductor substrate. The through-silicon via is electrically connect to the metal pad. The second substrate surface is opposite the first substrate surface. In examples of block 820, the through-silicon vias 126 and 526 are formed in the semiconductor substrates 102 and 502, respectively, and contact the metal pads 110 and 510, respectively, from the second substrate surfaces 108 and 508. The second substrate surfaces 108 and 508 are opposite the first substrate surfaces 106 and 506, respectively.

In certain embodiments, block 810 of the method 800 includes the additional block 812. In block 812, the metal interconnection structure is electrically connected to the metal pad through on or more conductive contacts. In examples of block 812, the set of conductive contacts 124/224/324/524 electrically connect the metal pad 110/210/310/510 to the metal interconnection structure 122/222/322/522, respectively.

Since the method 800 may be used in conjunction with the semiconductor devices and integrated circuits described previously, the descriptions of respective components of semiconductor devices and integrated circuits discussed above with respect to FIGS. 1-3 and 5-7 apply to those elements of method 800 with like names. Furthermore, method 800 is not limited, unless otherwise specified or understood by those of ordinary skill in the art, to the order shown in FIG. 8.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

Combination of Features

Features described above, as well as those claimed below, may be combined in various ways without departing from the scope hereof. The following enumerated examples illustrate some possible, non-limiting combinations:

(A1) In a first aspect, a semiconductor device with buried metal pad, includes a semiconductor substrate, having a first substrate surface and a second substrate surface thereopposite; a first inter-layer dielectric layer disposed on the first substrate surface; a second inter-layer dielectric layer disposed on the first inter-layer dielectric layer; a metal interconnection structure embedded within the second inter-layer dielectric layer; and a metal pad at least partly buried in the semiconductor substrate, electrically connected to the metal interconnection structure, and electrically isolated from the semiconductor substrate; wherein the semiconductor substrate forms an opening that extends from the second substrate surface to the metal pad.

(A2) In an embodiment of A1, the semiconductor device further includes an insulating liner layer on a surface of the semiconductor substrate that forms the opening and a conductive layer on the insulating liner layer and contacting the metal pad, thereby forming a through-silicon via landing on the metal pad.

(A3) In an embodiment of either of A1 or A2, the metal pad electrically connected to the metal interconnection structure by one or more conductive contact embedded in the first inter-layer dielectric layer.

(A4) In an embodiment of any of A1 through A3, the metal pad having a top surface that is coplanar with the first substrate surface to within a tolerance, for example within ten nanometers.

(A5) In an embodiment of any of A1 through A4, the metal pad having a width that is less than the width of the metal interconnection structure.

(A6) In an embodiment of any of A1 through A5, the metal pad being formed of at least one of aluminum, aluminum-copper alloy, tungsten, and a combination thereof (A7) In an embodiment of any of A1 through A6, further comprising a pixel array formed on the semiconductor substrate.

(A8) In an embodiment of any of A1 through A7, the semiconductor device further includes an insulating layer surrounding the metal pad and isolating the metal pad from the semiconductor substrate.

(A9) In an embodiment of any of A1 through A8, wherein the second inter-layer dielectric layer comprises a low-κ dielectric material and the first inter-layer dielectric layer comprises an oxide material.

(A10) In an embodiment of any of A1 through A9, a chip-scale package includes a semiconductor device as in any of A1 through A9, and a second semiconductor device electrically connected to and bonded to the semiconductor device.

(A11) In an embodiment of A10, the semiconductor device is an application specific integrated circuit (ASIC) device, and the second semiconductor device is an image sensor.

(B1) In a second aspect, a method for manufacturing a semiconductor device with buried metal pad includes etching a recess that extends into a first substrate surface of a semiconductor substrate, the semiconductor substrate having a second substrate surface opposite the first substrate surface; depositing a recess-insulating layer that coats a semiconductor substrate surface that forms the recess; depositing a metal layer in the recess, the recess-insulating layer electrically isolating the metal layer from the semiconductor substrate; etching the metal layer to form a metal pad within the recess; depositing a dielectric material to form a first inter-layer dielectric layer covering the first substrate surface and a top surface of the metal pad; forming at least one conductive contact that extends through the first inter-layer dielectric layer and contacts the metal pad; and forming, in the semiconductor substrate, an opening that extends from the second substrate surface to the metal pad.

(B2) In an embodiment of B1, the step of etching the metal layer further includes etching the metal layer to form the metal pad that has the top surface being coplanar with the first substrate surface to within a tolerance.

(B3) In an embodiment of either B1 or B2, further including forming a through-silicon via by depositing an insulating liner layer on a surface of the semiconductor substrate that forms the opening and depositing a conductive layer on the insulating liner layer, the conductive layer contacting the metal pad.

(B4) In an embodiment of any of B1 through B3, the step of depositing a dielectric material further includes the first inter-layer dielectric layer and the recess-insulating layer formed of a same material.

(B5) In an embodiment of any of B1 through B4, the method further includes forming a metal interconnection structure electrically connected to the metal pad through the at least one conductive contact and embedded in a second inter-layer dielectric layer disposed above the first substrate surface (B6) In an embodiment of any of B1 through B5, the step of forming at least one conductive contact further includes forming a plurality of equally-spaced conductive contacts that extend through the first inter-layer dielectric layer and contact the metal pad.

(B7) In an embodiment of any of B1 through B6, the step of depositing the metal layer further includes depositing at least one of aluminum, aluminum-copper alloy, tungsten, and a combination thereof.

(C1) In a third aspect, a method for stabilizing through-silicon via connections in semiconductor structures includes coupling electrically a metal interconnection structure to a metal pad that is submerged in a semiconductor substrate and is electrically isolated from the semiconductor substrate, the metal interconnection structure disposed on a first substrate surface of the semiconductor substrate; and forming a through-silicon via into the semiconductor substrate that contacts the metal pad from a second substrate surface of the semiconductor substrate and electrically connected to the metal pad, the second substrate surface opposite the first substrate surface.

(C2) In an embodiment of C1, the step of coupling electrically the metal interconnection structure to the metal pad includes electrically coupling the metal interconnection structure to the metal pad through one or more conductive contacts formed between the metal interconnection structure and the metal pad.

Any feature of the first, second, and third aspects described above are interchangeable with other of the described aspects, unless otherwise specified or understood by those of ordinary skill in the art."

What is claimed is:

1. A semiconductor device with buried metal pad, comprising:
   a semiconductor substrate, having a first substrate surface and a second substrate surface thereopposite;
   a first inter-layer dielectric layer disposed on the first substrate surface;
   a second inter-layer dielectric layer disposed on the first inter-layer dielectric layer;
   a metal interconnection structure embedded within the second inter-layer dielectric layer; and
   a metal pad at least partly buried in the semiconductor substrate, electrically connected to the metal interconnection structure, and electrically isolated from the semiconductor substrate;
   wherein the semiconductor substrate forms an opening that extends from the second substrate surface to the metal pad.

2. The semiconductor device of claim 1, further comprising an insulating liner layer on a surface of the semiconductor substrate that forms the opening and a conductive layer on the insulating liner layer and contacting the metal pad, thereby forming a through-silicon via landing on the metal pad.

3. The semiconductor device of claim 1, the metal pad electrically connected to the metal interconnection structure by one or more conductive contact embedded in the first inter-layer dielectric layer.

4. The semiconductor device of claim 1, the metal pad having a top surface that is coplanar with the first substrate surface to within a tolerance.

5. The semiconductor device of claim 1, the metal pad having a width that is less than the width of the metal interconnection structure.

6. The semiconductor device of claim 1, the metal pad being formed of at least one of aluminum, aluminum-copper alloy, tungsten, and a combination thereof.

7. The semiconductor device of claim 1, further comprising a pixel array formed on the semiconductor substrate.

8. The semiconductor device of claim 1, further comprising an insulating layer surrounding the metal pad and isolating the metal pad from the semiconductor substrate.

9. The semiconductor device of claim 1, wherein the second inter-layer dielectric layer comprises a low-κ dielectric material and the first inter-layer dielectric layer comprises an oxide material.

10. A chip-scale package comprising:
    a semiconductor device as in claim 1; and
    a second semiconductor device electrically connected to and bonded to the semiconductor device.

11. The chip-scale package of claim 10, wherein the semiconductor device is an application-specific integrated circuit (ASIC) device, and the second semiconductor device is an image sensor.

12. A method for manufacturing a semiconductor device with buried metal pad, comprising:
    etching a recess that extends into a first substrate surface of a semiconductor substrate, the semiconductor substrate having a second substrate surface opposite the first substrate surface;
    depositing a recess-insulating layer that coats a semiconductor substrate surface that forms the recess;
    depositing a metal layer in the recess, the recess-insulating layer electrically isolating the metal layer from the semiconductor substrate;
    etching the metal layer to form a metal pad within the recess;
    depositing a dielectric material to form a first inter-layer dielectric layer covering the first substrate surface and a top surface of the metal pad;
    forming at least one conductive contact that extends through the first inter-layer dielectric layer and contacts the metal pad; and
    forming, in the semiconductor substrate, an opening that extends from the second substrate surface to the metal pad.

13. The method of claim 12, the step of etching the metal layer further comprising etching the metal layer to form the metal pad that has the top surface being coplanar with the first substrate surface to within a tolerance.

14. The method of claim 12, further comprising forming a through-silicon via by depositing an insulating liner layer on a surface of the semiconductor substrate that forms the opening and depositing a conductive layer on the insulating liner layer, the conductive layer contacting the metal pad.

15. The method of claim 12, the step of depositing a dielectric material further comprising the first inter-layer dielectric layer and the recess-insulating layer formed of a same material.

16. The method of claim 12, further comprising forming a metal interconnection structure electrically connected to the metal pad through the at least one conductive contact and embedded in a second inter-layer dielectric layer disposed above the first substrate surface.

17. The method of claim 12, the step of forming at least one conductive contact further comprising forming a plurality of equally-spaced conductive contacts that extend through the first inter-layer dielectric layer and contact the metal pad.

18. The method of claim 12, the step of depositing the metal layer further comprising depositing at least one of aluminum, aluminum-copper alloy, tungsten, and a combination thereof.

19. A method for stabilizing through-silicon via connections in semiconductor structures, comprising:
    coupling electrically a metal interconnection structure to a metal pad that is submerged in a semiconductor substrate and is electrically isolated from the semiconductor substrate, the metal interconnection structure disposed on a first substrate surface of the semiconductor substrate; and
    forming a through-silicon via into the semiconductor substrate that contacts the metal pad from a second substrate surface of the semiconductor substrate and electrically connected to the metal pad, the second substrate surface opposite the first substrate surface.

20. The method of claim 19, the step of coupling electrically the metal interconnection structure to the metal pad comprising electrically coupling the metal interconnection structure to the metal pad through one or more conductive contacts formed between the metal interconnection structure and the metal pad.

* * * * *